US009368615B2

United States Patent
Burke et al.

(10) Patent No.: US 9,368,615 B2
(45) Date of Patent: Jun. 14, 2016

(54) TRENCH POWER FIELD EFFECT TRANSISTOR DEVICE AND METHOD

(71) Applicant: SEMICONDUCTOR COMPONENTS INDUSTRIES, LLC, Phoenix, AZ (US)

(72) Inventors: Peter A Burke, Portland, OR (US); Agajan Suwhanov, Portland, OR (US); Prasad Venkatraman, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/177,140

(22) Filed: Feb. 10, 2014

(65) Prior Publication Data
US 2014/0151788 A1 Jun. 5, 2014

Related U.S. Application Data

(62) Division of application No. 13/487,479, filed on Jun. 4, 2012, now Pat. No. 8,648,412.

(51) Int. Cl.
| | |
|---|---|
| *H01L 29/76* | (2006.01) |
| *H01L 29/78* | (2006.01) |
| *H01L 29/66* | (2006.01) |
| *H01L 29/10* | (2006.01) |
| *H01L 21/265* | (2006.01) |
| *H01L 29/40* | (2006.01) |
| *H01L 29/417* | (2006.01) |
| *H01L 29/423* | (2006.01) |
| *H01L 29/49* | (2006.01) |

(52) U.S. Cl.
CPC ........ *H01L 29/7813* (2013.01); *H01L 29/1095* (2013.01); *H01L 29/66727* (2013.01); *H01L 29/66734* (2013.01); *H01L 21/26506* (2013.01); *H01L 29/407* (2013.01); *H01L 29/41766* (2013.01); *H01L 29/42368* (2013.01); *H01L 29/4933* (2013.01)

(58) Field of Classification Search
CPC .................. H01L 29/7813; H01L 29/4236
USPC .................. 257/329–330; 438/270, 588
See application file for complete search history.

(56) References Cited

U.S. PATENT DOCUMENTS

| | | | |
|---|---|---|---|
| 5,338,945 | A | 8/1994 | Baliga |
| 5,360,749 | A | 11/1994 | Anjum |
| 6,037,640 | A | 3/2000 | Lee |
| 7,071,046 | B2 | 7/2006 | Yang |
| 7,262,105 | B2 | 8/2007 | Jawarani |
| 7,317,252 | B2 | 1/2008 | Mauder |
| 7,338,880 | B2 | 3/2008 | Lim |
| 7,915,672 | B2 | 3/2011 | Venkatraman |
| 8,362,550 | B2 | 1/2013 | Rexer et al. |
| 2002/0142553 | A1 | 10/2002 | Jenq |
| 2002/0187614 | A1 | 12/2002 | Downey |
| 2006/0273386 | A1 | 12/2006 | Yilmaz et al. |

(Continued)

OTHER PUBLICATIONS

F. B. McLean et al., Charge Funneling in N- and P- type Si Substrates, IEEE Transactions on Nuclear Science, vol. NS-29, No. 6, Dec. 1982, pp. 2017-2023.

(Continued)

*Primary Examiner* — Theresa T. Doan
(74) *Attorney, Agent, or Firm* — Daniel J. Anderson

(57) ABSTRACT

In one embodiment, a structure for a trench power field effect transistor device with controlled, shallow, abrupt, body contact regions.

9 Claims, 6 Drawing Sheets

(56) References Cited

U.S. PATENT DOCUMENTS

| | | | |
|---|---|---|---|
| 2007/0238234 A1 | 10/2007 | Wang | |
| 2008/0023732 A1 | 1/2008 | Felch | |
| 2010/0003799 A1 | 1/2010 | Lee | |
| 2010/0123188 A1* | 5/2010 | Venkatraman | 257/330 |
| 2010/0171173 A1 | 7/2010 | Hsieh | |

OTHER PUBLICATIONS

Mehmet C. Ozturk, Optimization of the Germanium Preamorphization Conditions for Shallow-Junction Formation, IEEE Transactions on Electron Devices, vol. 35, No. 5, May 1988.

B. J. Pawlak et al., Optimizing p-type ultra-shallow junctions for the 65 nm CMOS technology node, Ion Implantation Technical Conf., 2003.

James R. Pfiester et al., Improved CMOS Field Isolation Using Germanium/Boron Implantation, IEEE Electron Device Letters, vol. 9, No. 8, Aug. 1988, pp. 391-393.

V. Raineri et al., Reduction of boron diffusion in silicon by 1 Mev Si+ irradiation, Applied Physics Letters, 58 (9), Mar. 4, 1991, pp. 922-924.

Agajan Suvkhanov et al., X-ray and secondary ion mass spectrometry investigation of activation behavior of self-preamorphized Si substrate, J. Vac. Sci.Tech. B 22(1), Feb. 2004.

Hideki Takeuchi et al., Improved PMOSFET Short-Channel Performance Using Ultra-Shallow Si Ge Source/Drain Extensions, IEDM Tech. Digest, 1999, pp. 501-504.

* cited by examiner

TRENCH POWER FIELD EFFECT TRANSISTOR DEVICE AND METHOD

CROSS-REFERENCE TO RELATED APPLICATIONS

This application is a divisional application of prior U.S. patent application Ser. No. 13/487,479, filed on Jun. 4, 2012, which is hereby incorporated by reference, and priority thereto is hereby claimed.

BACKGROUND

This document relates generally to semiconductor devices, and more specifically to trench power field effect transistors (FET).

Manufacturers of integrated circuits are continually seeking ways to reduce manufacturing costs and thereby increase profits. One way in which manufacturers of integrated circuits can reduce manufacturing costs is by increasing the number of integrated circuits they form on each semiconductor wafer. An increased number of integrated circuits per semiconductor wafer can be accomplished by reducing the distance or "pitch" between various circuit features, elements, and components. Unfortunately, when circuit features, elements, and components are placed closer together they may begin to unintentionally interact or sometimes even overlap other features, elements, and components of the circuit. These unintended interactions may interfere with the operation and characteristics of the integrated circuit. For example, in a trench power MOSFET device, a reduction in pitch could be obtained by reducing the distance between the source-body contact and the trenched gate. However, by bringing the source-body contact closer to the trenched gate, the body contact region, which may be doped at a higher dopant concentration than the body region, may begin to interfere with, or even overlap, the device's inversion channel. This interference can affect the threshold voltage and other characteristics of the device.

Accordingly, it is desirable to be able to reduce the pitch of trench power FET devices in integrated circuits without having the features, elements or components of the integrated circuit unintentionally interact or overlap with each other.

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein current-carrying electrode means an element of a device that carries current through the device such as a source or a drain of an MOS transistor, an emitter or a collector of a bipolar transistor, or a cathode or anode of a diode, and a gate electrode means an element of the device that controls current through the device such as a gate of a MOS transistor.

Although the devices are explained herein as certain N-channel devices, a person of ordinary skill in the art understands that P-channel devices and complementary devices are also possible in accordance with the present description. For clarity of the drawings, some doped regions of device structures may be illustrated as having generally straight-line edges and precise angular corners. However, those skilled in the art understand that due to the diffusion and activation of dopants, the edges of doped regions are generally not straight lines and the corners are not precise angles.

Furthermore, the term "major surface" when used in conjunction with a semiconductor region or substrate means the surface of the semiconductor region or substrate that forms an interface with another material, such as a dielectric, an insulator, a conductor, or a polycrystalline semiconductor. The major surface can have a topography that changes in the x, y and z directions.

In addition, structures of the present description may embody either a cellular base design (where the body regions are a plurality of distinct and separate cellular or stripe regions) or a single base design (in which the body region is a single region formed in an elongated pattern, typically in a serpentine pattern or a central portion with connected appendages). However, one embodiment of the present description will be described as a cellular base design throughout the description for ease of understanding. It should be understood that the present disclosure encompass both a cellular base design and a single base design.

DETAILED DESCRIPTION OF THE DRAWINGS

Figure 1:
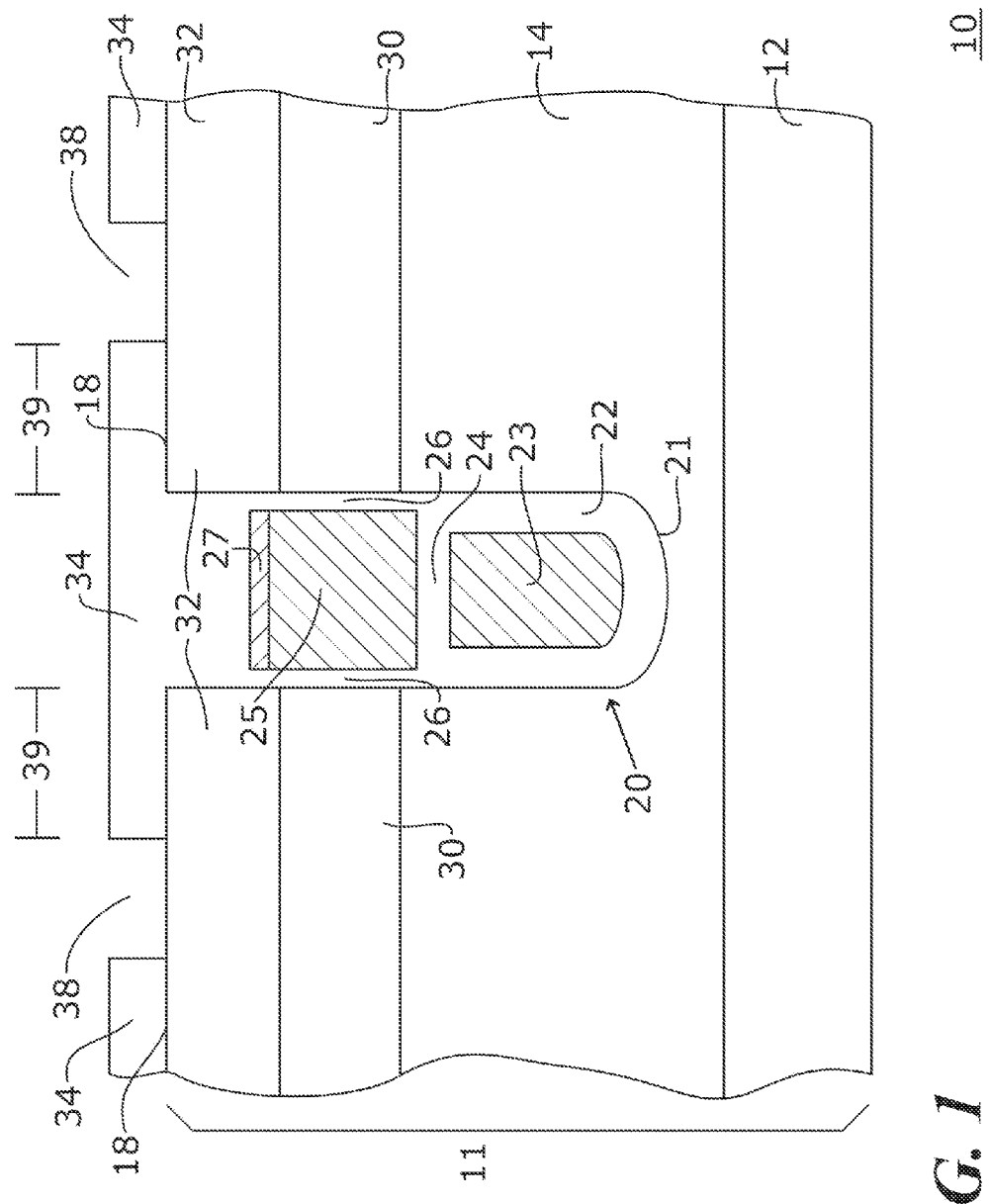
FIGS. 1-6 illustrate partial cross-sectional views of a semiconductor device at various stages of fabrication in accordance with embodiments of the present invention.

FIG. 1 illustrates a partial cross-sectional view of a semiconductor device or cell 10 at a stage of fabrication in accordance with one embodiment. In this embodiment, device 10 comprises a MOSFET structure at a stage of fabrication, but it is understood that this description applies as well to other semiconductor devices and structures.

Device 10 includes a region of semiconductor material, semiconductor material, or semiconductor region 11, which comprises, for example, an n-type silicon substrate 12, a semiconductor layer, drift region, or extended drain region 14, a body, base, PHV, or doped region or regions 30, and source regions, current conducting regions, or current carrying regions 32. It is understood that other materials may be used for semiconductor material 11 or portions thereof including silicon-germanium, carbon-doped silicon, silicon carbide, and other related or equivalent materials as known by one of ordinary skill in the art.

In this embodiment substrate 12 can have a resistivity ranging from 0.001 ohm-cm to about 0.005 ohm-cm. Substrate 12 can be doped, for example, with phosphorous, arsenic, or antimony. In the embodiment shown, substrate 12 provides a drain region, drain contact, or a first current carrying contact for device 10.

A semiconductor layer 14 can be formed, in, on, or overlying substrate 12. In one embodiment, semiconductor layer 14 can be formed using semiconductor epitaxial growth techniques. These techniques may comprise a single epitaxial layer or multiple epitaxial layers. Alternatively, in other embodiments, semiconductor layer 14 can be formed using semiconductor doping and diffusion techniques, for example, using ion implantation or thermal diffusion. In an embodiment suitable for a 20-30 V device, semiconductor layer 14 can be n-type with a dopant concentration of about $1.0 \times 10^{16}$ to about $1.0 \times 10^{18}$ atoms/cm$^3$, and can have a thickness from about 3 microns to about 7 microns. The thickness and dopant concentration of semiconductor layer 14 can be increased or decreased depending on the desired drain-to-source breakdown voltage ($BV_{DSS}$) rating of device 10.

Body regions 30 extend from a major surface 18 of semiconductor material 11. Body regions 30 extend from major surface 18 to a depth, for example, from about 0.5 microns to about 2.0 microns. Body regions 30 have a conductivity type that is opposite to the conductivity type of semiconductor layer 14. In this example, body regions 30 are p-type conductivity. Body regions 30 have a dopant concentration suitable for forming inversion layers that operate as conductive channels or conductive regions within portions of body regions 30, that are adjacent to a trench 21.

Source regions 32 are formed within, in or overlying body regions 30 and extend from major surface 18 to a depth of about 0.1 microns to about 0.5 microns. Source regions 32 have a conductivity type that is opposite to the conductivity type body regions 30.

Referring still to the embodiment shown in FIG. 1, device 10 further includes trench control, trench gate, or trench structure 20, which extends in a substantially vertical direction from major surface 18. Alternatively, in other embodiments, trench structure 20, or portions thereof, can have a tapered shape. Trench structure 20 includes a trench 21, passivating layers, interlayer dielectric, dielectric layers, insulator layers, field insulator layers or regions 22, 24, 26 and 34, a shield electrode 23, and a control electrode or gate electrode 25.

Trench 21 can be formed in semiconductor layer 14. For example, trench 21 can have a depth of about 1.2 microns to about 2.5 microns or deeper. In one embodiment, trench 21 extends all the way through semiconductor layer 14 and into substrate 12. In another embodiment, trench 22 terminates within semiconductor layer 14.

An insulator layer 22 is formed on a lower portion of trench 21 and comprises, for example, an oxide, a nitride, combinations thereof, or other related or equivalent materials as known by one of ordinary skill in the art. In one embodiment, insulator layer 22 is a silicon oxide and has a thickness from about 0.08 microns to about 0.2 microns. Insulator layer 22 can be uniform in thickness or variable in thickness. Additionally, the thickness of insulator layer 22 can be varied, depending on the desired drain-to-source breakdown voltage ($BV_{DSS}$). A shield electrode 23 is formed overlying insulator layer 22 in a lower portion of trench 21. In one embodiment, shield electrode 23 comprises polycrystalline semiconductor material that can be doped. In another embodiment, shield electrode 23 comprises other conductive materials.

Insulator layers 26 are formed along upper sidewall portions of trench 21 and are configured as gate dielectric regions or layers. By way of example, insulator layers 26 comprise silicon oxide, silicon nitride, tantalum pentoxide, titanium dioxide, barium strontium titanate, combinations thereof, or other related or equivalent materials as known by one of ordinary skill in the art. In one embodiment, insulator layers 26 are silicon oxide and have a thickness from about 0.01 microns to about 0.1 microns. In one embodiment insulator layer 22 is thicker than insulator layers 26. Insulator layer 24 is formed overlying shield electrode 23, and in one embodiment, insulator layer 24 has a thickness between the thickness of insulator layer 22 and insulator layers 26. In one embodiment, insulator layer 24 has a thickness greater than the thickness of insulator layers 26, which improves oxide breakdown voltage performance. In another embodiment, insulator layer 24 has a thickness greater than the thickness of insulator layer 22.

Gate electrode 25 is formed overlying insulator layer 24 and insulator layers 26. In one embodiment, gate electrode 25 comprises doped polycrystalline semiconductor material such as polysilicon doped with an n-type dopant. In one embodiment trench structure 20 further includes a metal or silicide layer 27 formed adjoining gate electrode 25 or upper surfaces thereof. Layer 27 is configured to reduce gate resistance. In an alternative embodiment, trench structure 20 is formed without insulator layer 24 such that gate electrode 25 and shield electrode 23 form a single electrode.

Dielectric layer 34 is formed overlying major surface 18 and above trench structure 20. In one embodiment, dielectric layer 34 comprises a silicon oxide and has a thickness from about 0.4 microns to about 1.0 micron. In one embodiment, dielectric layer 34 comprises a deposited silicon oxide doped with phosphorus or boron and phosphorus. In one embodiment, dielectric layer 34 is planarized to provide a more uniform surface topography, which improves manufacturability. In one embodiment, dielectric layer 34 is patterned using conventional photolithography and etching techniques to form openings 38 in dielectric layer 34. In one embodiment, openings 38 can have an initial width of about 0.1 microns to about 0.5 microns. In one embodiment, inner walls of openings 38 can be spaced apart, in a lateral direction, a distance 39 from walls of trench 21. In one embodiment distance 39 can measure from about 0.05 microns to about 0.25 microns.

Figure 2:
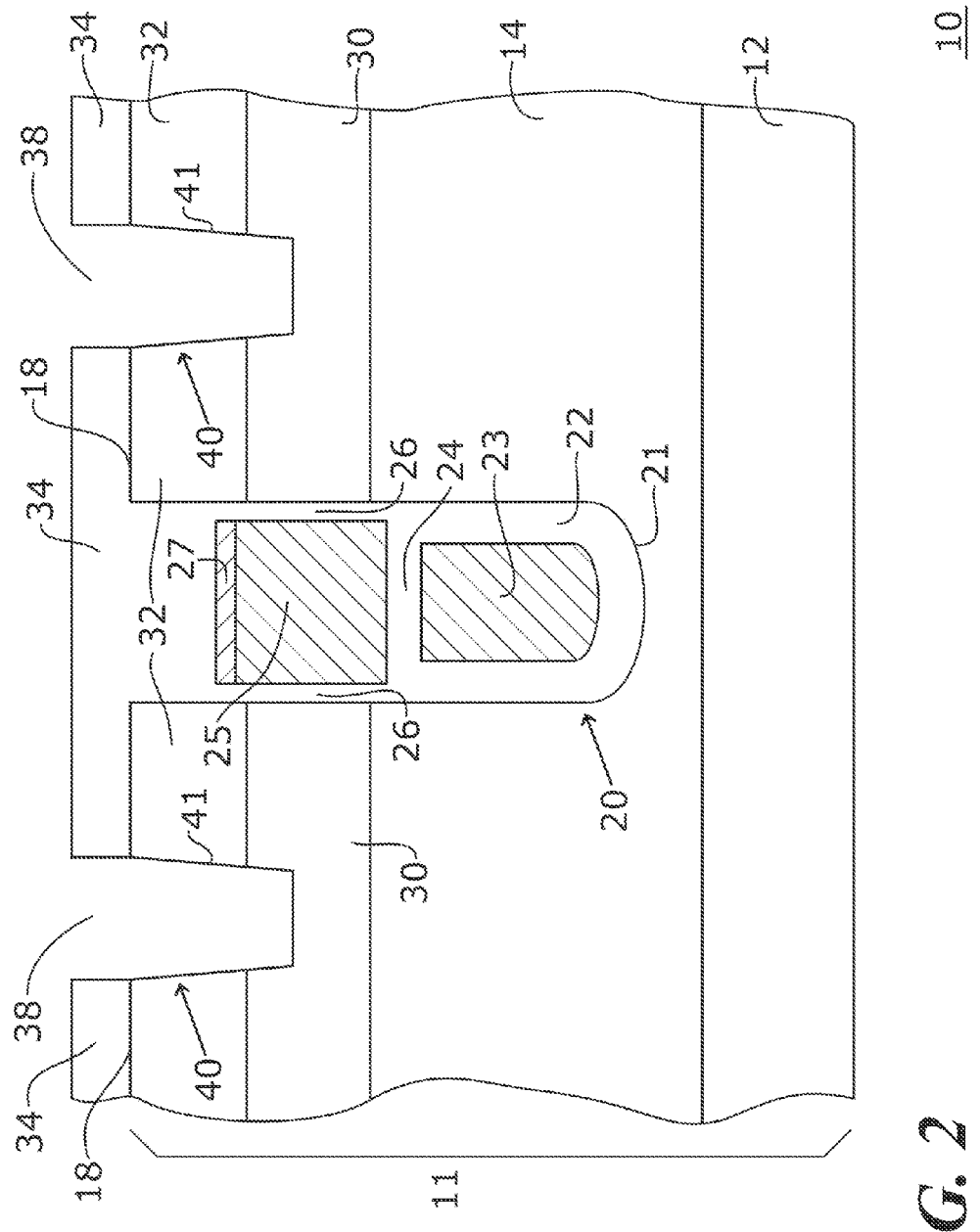

FIG. 2 illustrates a partial cross-sectional view of a semiconductor device or cell 10 shown in FIG. 1 after additional processing. After openings 38 are formed, portions of semiconductor material 11 can be etched to form contact vias 41 extending from major surface 18. Contact vias 41 are formed as part of body contact structures 40. By way of example, contact vias 41 can be formed using plasma etching techniques with a fluorocarbon chemistry or a fluorine-based chemistry (e.g. $SF_6/O_2$). In one embodiment, the depth of contact vias 41 can be about 0.15 microns to about 0.5 microns.

Figure 3:
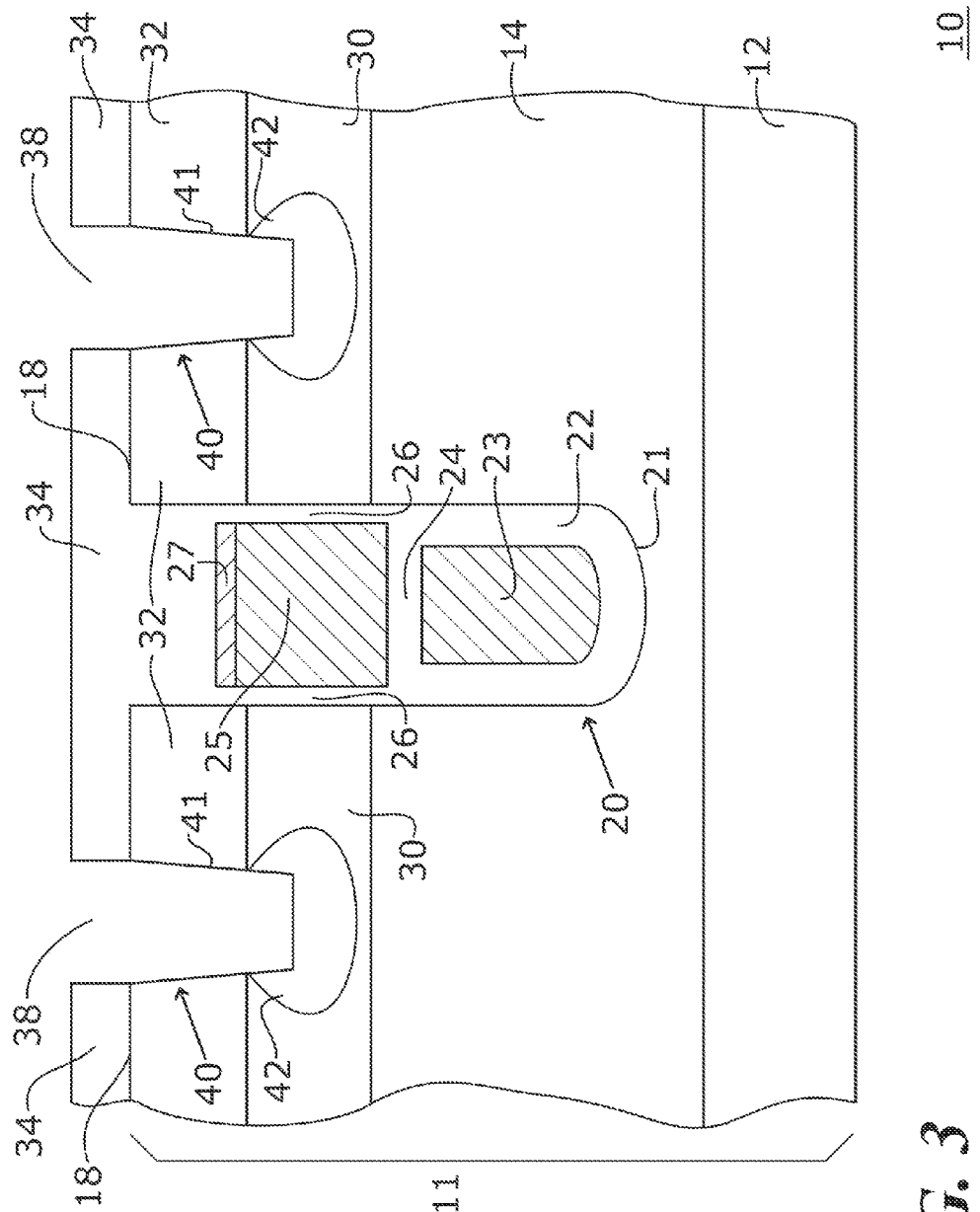

FIG. 3 illustrates a partial cross-sectional view of device 10 shown in FIG. 2 after additional processing. Amorphized regions 42 are formed within body regions 30. Amorphized regions 42 can be formed using doping techniques, such as ion implantation. Amorphizing implantation ions can comprise germanium, silicon, argon, xenon, combinations thereof, and related or equivalent materials as known by one of ordinary skill in the art. In one embodiment, the amorphizing implantation ion comprises germanium. Depending on desired size and spread of amorphized regions 42, the germanium ion implantation dose may range from about $1 \times 10^{13}$ atoms/cm$^3$ to about $1 \times 10^{16}$ atoms/cm$^3$ at an energy level of about 40 KeV to about 150 KeV.

While amorphized regions 42 are depicted as having fixed boundaries for the purpose of discussion, it is understood that, in practice, no such fixed boundaries exist and the degree of crystal amorphization can decrease gradually as it extends outwardly.

Figure 4:
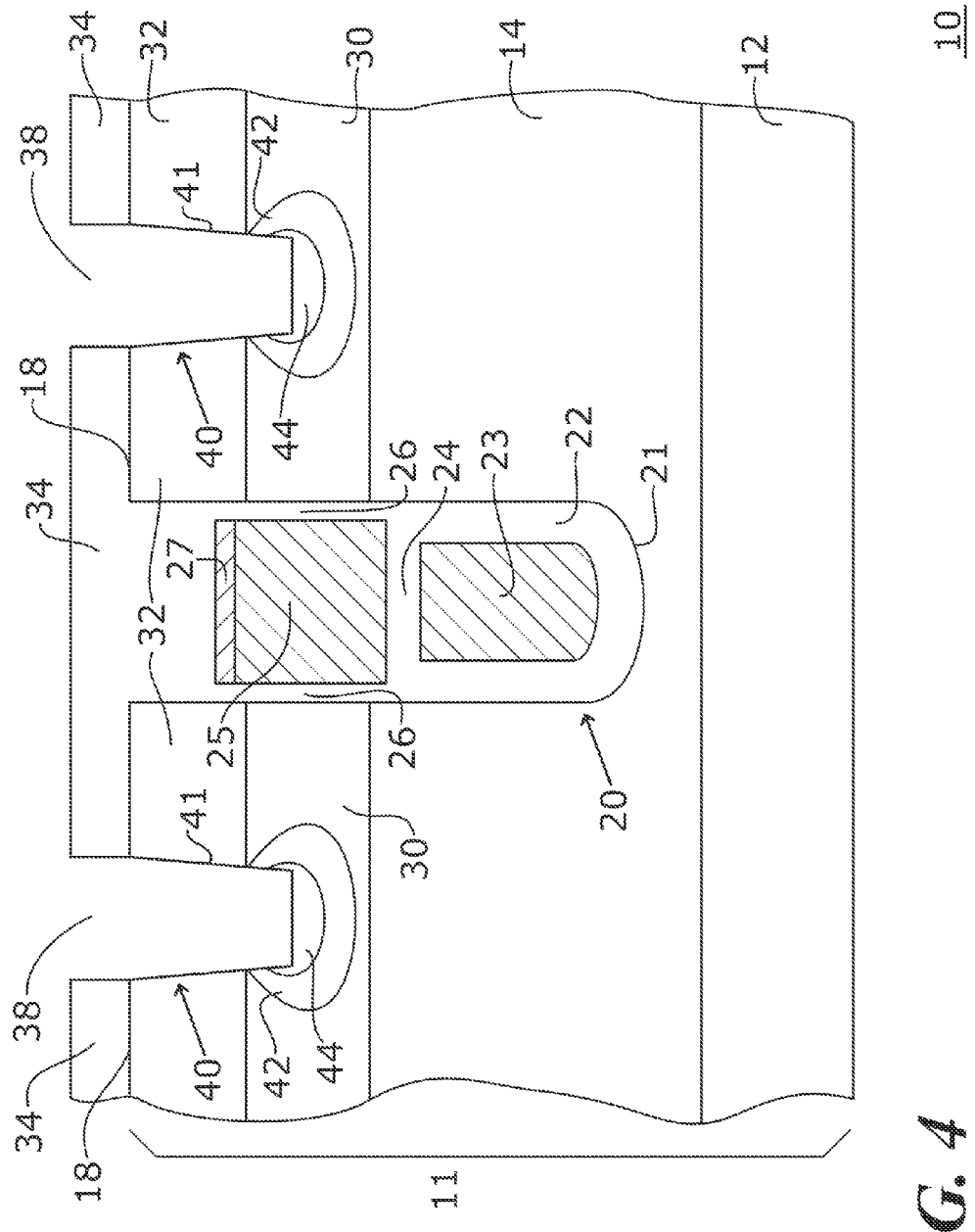

FIG. 4 illustrates a partial cross-sectional view of device 10 shown in FIG. 3 after additional processing. Body contact regions 44 are formed within amorphized regions 42. Body contact regions 44 can be formed using doping techniques, such as ion implantation and anneal techniques. Ion implantation may comprise boron, boron difluoride, or other related or equivalent materials as known by one of ordinary skill in the relevant art. Body contact regions 44 have a dopant concentration greater than that of body regions 30 and sufficient to form ohmic contacts. In one embodiment the ion implantation comprises a boron-11 species and, depending on desired dopant concentration and size and spread of body contact regions 44, the boron-11 ion implantation dose may range from about $1 \times 10^{14}$ atoms/cm$^3$ to about $5 \times 10^{15}$ atoms/cm$^3$ at an energy level of about 200 eV to about 20 KeV. In another embodiment, the ion implantation comprises a boron difluoride species and, depending on desired dopant concentration and size and spread of body contact regions 44, the boron difluoride ion implantation dose may range from about $1\times10^{14}$ atoms/cm$^3$ to about $5\times10^{15}$ atoms/cm$^3$ at an energy level of about 200 eV to about 80 KeV.

While body contact regions 44 are depicted as having fixed boundaries for the purpose of discussion, it is understood that, in practice, no such fixed boundaries exist and the concentration of dopant can decrease gradually as it extends outwardly.

In accordance with the present embodiment, the amorphized structure of amorphized regions 42 are configured to reduce the scattering, channeling, spread or diffusion of the dopant ions during the ion implantation step. The result of this technique is that highly doped contact regions 44 are more confined to smaller regions than would be created by an ion implantation in a non-amorphized region. This same result is further exploited during subsequent annealing steps.

Figure 5:
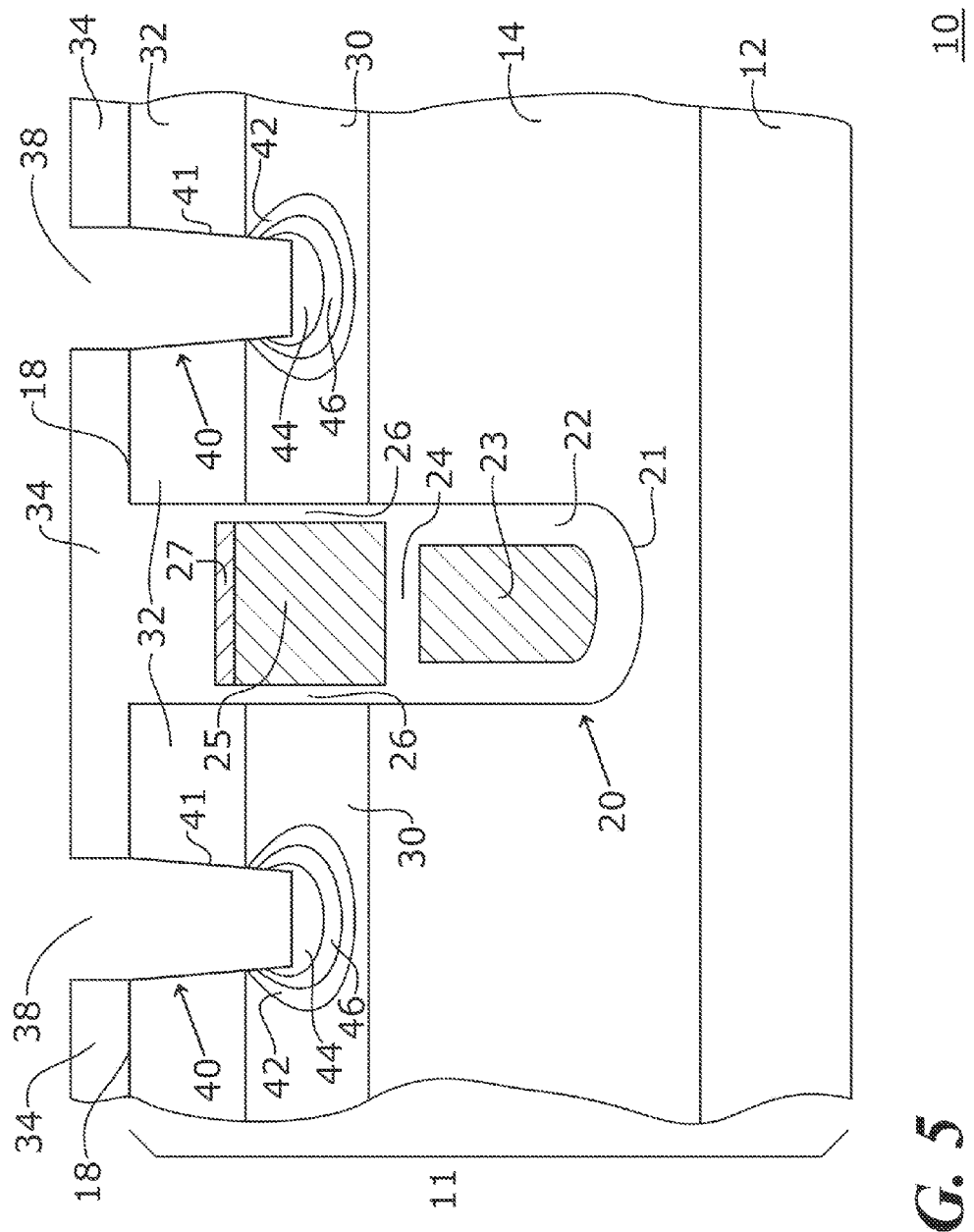

FIG. 5 illustrates a partial cross-sectional view of device 10 shown in FIG. 4 after additional processing. Subsequent to the ion implantation step described above, device 10 can be annealed. In one embodiment, device 10 is subjected to a rapid thermal annealing process at a temperature of about 900 degrees Celsius (° C.) to about 1100 degrees Celsius (° C.) for about 2 seconds to about 180 seconds. During annealing, amorphized regions 42 will tend to re-crystallize and lose their amorphized character. Furthermore, during annealing, dopant ions in body contact regions 44 will tend to diffuse outwardly. This outward diffusion is represented by body contact regions 46. As mentioned previously, the amorphized structure of amorphized regions 42 is configured to reduce the scattering, channeling, spread or diffusion of the dopant ions during annealing steps. This results in a shallower, more abrupt or contained region for body contact regions 46 than the region that would otherwise result after similar annealing of a non-amorphized region. The shallow, abrupt configuration of body contact regions 46 allow for an increased dopant concentration without substantially increasing the size of body contact regions 46. This higher dopant concentration can prevent device 10 from failing under various circumstances. For example, in a MOSFET device, during device operation, inductive spikes can lead to a voltage $V_{DS}$ that exceeds the rated level for the MOSFET device. During the spike, the $V_{DS}$ is in excess of the bulk breakdown of the MOSFET device and can lead to device failure. Here, the well-controlled, body contact regions 46 can act as current sinks able to withstand higher energy dissipation during inductive spike, thus preventing a MOSFET device from failure. Additionally, the above described configuration also allows for body contact structures 40 to be placed closer to trench structure 20 without creating undesired interaction and interference between body contact regions 46 and channels 55 (described below) of device 10. This reduction of pitch in critical dimension 56 of device 10 can reduce manufacturing cost and increase profits as the die size is reduced. Thus, the above described features may both increase the ruggedness of device 10 and reduce manufacturing costs of device 10.

Figure 6:
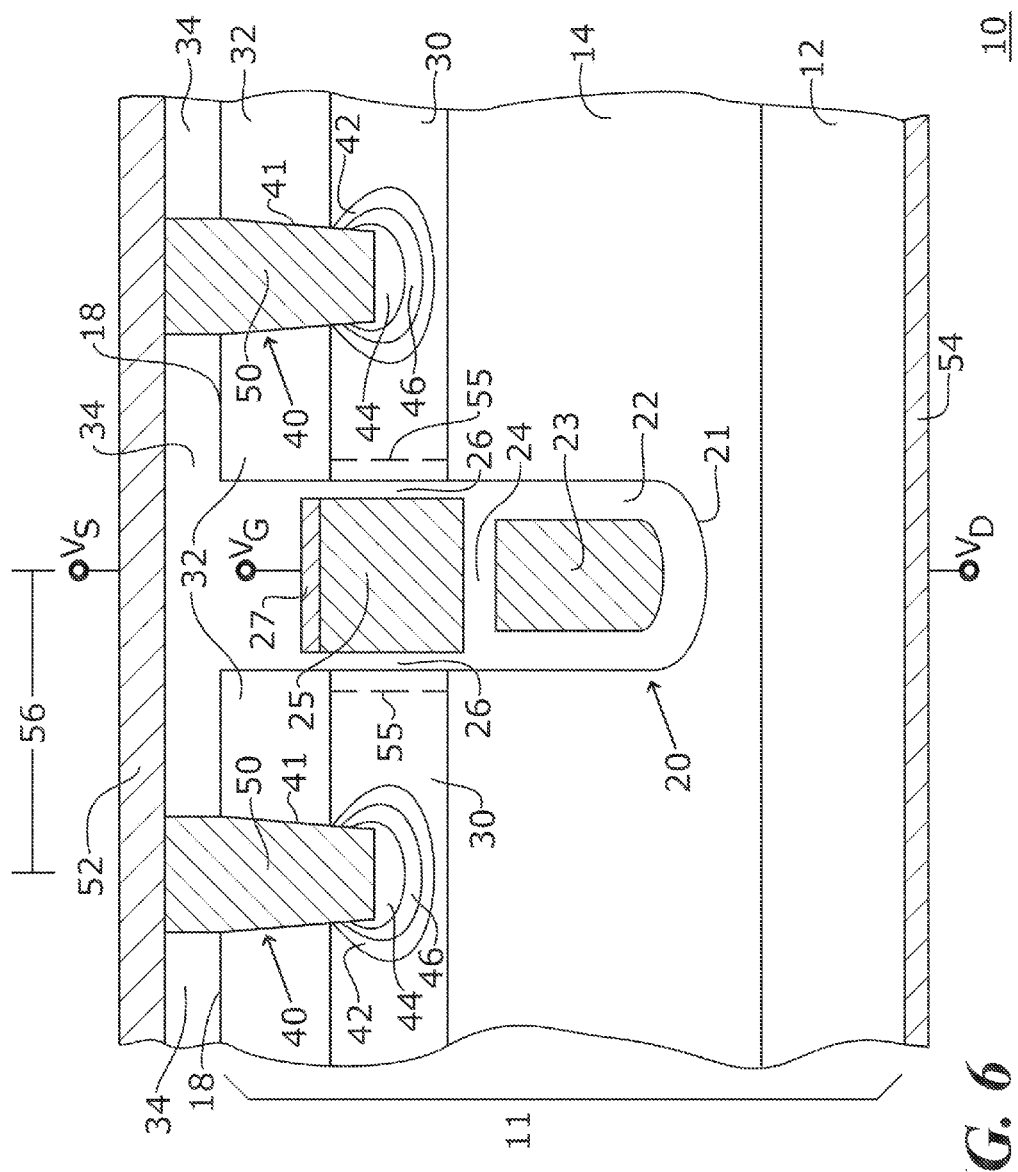

FIG. 6 illustrates a partial cross-sectional view of device 10 shown in FIG. 5 after additional processing. Conductive regions or plugs 50 are formed in contact vias 41 and openings 38 to provide for electrical contact to source regions 32 and to provide electrical contact to body regions 30 through body contact regions 46. In one embodiment, conductive regions 50 are conductive plugs or plug structures. In one embodiment, conductive regions 50 comprise a conductive barrier structure or liner plus a conductive fill material. In one embodiment, the barrier structure includes a metal/metal-nitride configuration such as titanium/titanium-nitride or other related or equivalent materials as known by one of ordinary skill in the relevant art. In another embodiment, the barrier structure further includes a metal-silicide structure. In one embodiment, the conductive fill material includes tungsten. In one embodiment conductive regions 50 are planarized to provide a more uniform surface topography. The planarization may be accomplished using chemical mechanical polishing (CMP), photoresist etchback, or other related or equivalent techniques as known by one of ordinary skill in the relevant art.

A conductive layer 52 is formed overlying major surface 18 and a conductive layer 54 is formed overlying a surface of semiconductor material 11 opposite major surface 18. Conductive layers 52 and 54 are configured to provide electrical connection between the individual device components of device 10 and a next level of assembly. In one embodiment, conductive layer 52 is titanium/titanium-nitride/aluminum-copper or other related or equivalent materials as known by one of ordinary skill in the relevant art and is configured as a source electrode or terminal. In one embodiment, conductive layer 54 is a solderable metal structure such as titanium-nickel-silver, chromium-nickel-gold, or other related or equivalent materials as known by one of ordinary skill in the relevant art and is configured as a drain electrode or terminal. In one embodiment, a further passivation layer (not shown) is formed overlying conductive layer 52. In one embodiment, shield electrode 23 is configured to be at the same potential as source regions 32 when device 10 is in use. In another embodiment, shield electrode 23 is configured to be independently biased. In another embodiment, shield electrode 23 is configured to be at the same potential as gate electrode 25.

In one embodiment, the operation of device 10 proceeds as follows. Assume that source electrode (or input terminals) 52 and shield electrode 25 are operating at a potential $V_S$ of zero volts, gate electrode 25 receives a control voltage $V_G$ of 5.0 volts, which is greater than the conduction threshold of device 10, and drain electrode (or output terminal) 54 operates at a drain potential VD of 1.0 volts. The values of $V_G$ and $V_S$ cause body region 30 to invert adjacent to gate electrode 25 to form channels 55, which electrically connect source regions 32 to semiconductor layer 14. A device current $I_{DS}$ flows from drain electrode 54 and is routed through source regions 32, channels 55, and semiconductor layer 14 to source electrode 52. In one embodiment, $I_{DS}$ is on the order of 1.0 amperes. To switch device 10 to the off state, a control voltage $V_G$ of less than the conduction threshold of device 10 is applied to gate electrode 25 (e.g. $V_G$=0 volts in this embodiment). This removes channels 55 and $I_{DS}$ no longer flows through device 10.

Shield electrode 23 is configured to control the width of the depletion layer between body regions 30 and semiconductor layer 14, which enhances source-to-drain breakdown voltage. Also, shield electrode 23, when configured to be at the same potential as source regions 32, helps reduce gate-to-drain charge of device 10. Additionally, because there is less overlap of gate electrode 25 with semiconductor layer 14 compared to other structures, the gate-to-drain capacitance of device 10 is reduced. These features enhance the switching characteristics of device 10.

The above described configurations and embodiments allow for body contact structures 40 to be placed closer to trench structure 20 without creating undesired interaction and interference between body contact regions 46 and channels 55 (described below) of device 10. This reduction of pitch in critical dimension 56 of device 10 can reduce manufacturing cost and increase profits as the die size is reduced.

From all the foregoing, one skilled in the art can determine that according to one embodiment, a method of forming a semiconductor device includes the act of providing a region of semiconductor material (for example, element 11) of a first conductivity type having a first major surface (for example, element 18). The method includes forming a trench (for example, element 21) in the region of semiconductor material extending from the first major surface. The method includes forming an insulator layer (for example, elements 22, 24, 26, 34) adjacent sidewall surfaces of the trench. The method includes forming a control electrode (for example, element 25) in the trench and overlying a portion of the insulator layer (for example, elements 22, 24). The method includes forming a body region (for example, element 30) of a second conductivity type within the region of semiconductor material, where the control electrode is configured to control a channel (for example, element 55) in the body region. The method includes forming a source region (for example, element 32) within the body region and forming a body contact structure (for example, element 40) extending from the major surface. The method includes forming an amorphized body region (for example, element 42) within the body region and connected to the body contact structure, where the act of forming the amorphized body region includes a first ion implantation. The method includes forming a body contact region (for example, elements 44, 46) of a second conductivity type within the amorphized body region, where the act of forming the body contact region includes a second ion implantation. The method includes annealing the body contact region and forming a conductive region (for example, element 50) within the body contact structure extending from the major surface and contacting the body contact region.

Those skilled in the art will also appreciate that according to another embodiment, a method of forming a semiconductor device includes the acts of providing a region of semiconductor material (for example, element 11) of a first conductivity type having a first major surface (for example, element 18). The method includes forming a trench (for example, element 21) in the region of semiconductor material extending from the first major surface. The method includes forming an insulator layer (for example elements 22, 24, 26, 34) adjacent sidewall surfaces of the trench. The method includes forming a shield electrode (for example, element 23) in a bottom portion of the trench and overlying a portion of the insulator layer. The method includes forming a control electrode (for example, element 25) in the trench and overlying the shield electrode. The method includes forming a body region (for example, element 30) of a second conductivity type within the region of semiconductor material, wherein the control electrode is configured to control a channel (for example, element 55) in the body region. The method includes forming a source region (for example, element 32) within the body region. The method includes forming a body contact structure (for example, element 40) extending from the major surface. The method includes forming an amorphized body region (for example, element 42) within the body region and connected to the body contact structure, where the act of forming the amorphized body region includes a first ion implantation, and where the amorphized body region is configured to reduce ion channeling of dopant ions during a subsequent ion implantation. The method includes forming a body contact region (for example, elements 44, 46) of a second conductivity type within the amorphized body region, where the act of forming the body contact region includes the subsequent ion implantation. The method includes annealing the body contact region. The method includes forming a conductive region (for example element 50) within the body contact structure extending from the major surface and contacting the body contact region.

Those skilled in the art will also appreciate that according to another embodiment, a semiconductor device includes a region of semiconductor material (for example, element 11) of a first conductivity type having a major surface (for example element 18) and a trench (for example, element 21) extending into the region of semiconductor material from the major surface. The device includes an insulator layer (for example, elements 22, 24, 26, 34) formed adjacent sidewall surfaces of the trench and a shield electrode (for example, element 23) in a bottom portion of the trench and overlying a portion of the insulator layer. The device includes a gate electrode (for example, element 25) in the trench and overlying the shield electrode and a body region (for example, element 30) of a second conductivity type formed within the region of semiconductor material and adjacent to the gate electrode. The device includes a source region (for example, element 32) of the first conductivity type within the body region and a body contact structure (for example element 40) extending from the major surface and comprising a conductive region (for example, element 50). The device includes a body contact region (for example, elements 44, 46) of the second conductivity type within the body region and connected to the body contact structure, where the body contact region is formed as a result of a first ion implantation, a second ion implantation and a subsequent annealing, where the first ion implantation includes a germanium, a silicon, an argon, or a xenon ion implantation, and where the second ion implantation includes a boron or a boron difluoride ion implantation.

Those skilled in the art will also appreciate that according to yet another embodiment, a process for forming a semiconductor device includes providing a region of semiconductor material (for example, element 11) having a trench control structure (for example, elements 25, 26) extending from a major surface, a body region (for example, element 30), and a source region (for example, element 32) within the body region, wherein the body region and the trench control structure are adjacent. The process includes ion implanting at least one of germanium, silicon, argon, and xenon into a portion of the body region to form a first region (for example, element 42), wherein the first region is spaced apart from the trench control structure and spaced apart from the major surface. The process includes forming a body contact region (for example, elements 44, 46) within the first region and forming a conductive contact structure (for example, elements 40, 50) coupled to the source region and the body contact region.

Those skilled in the art will also appreciate that according to a further embodiment, in the process described in paragraph [0036] the act of forming the body contact region includes ion implanting a dopant species into the first region and annealing the implanted dopant species, wherein the first region is configured to restrict movement of implanted dopant species within the body region.

Those skilled in the art will also appreciate that according to a still further embodiment, in the process described in paragraph [0036] the act of providing the region of semiconductor material includes providing the region of semiconductor material having an insulated shield electrode structure (for example, elements 22, 23) in spaced relationship with the trench control structure.

In view of all of the above, it is evident that a novel method and device is disclosed. Included, among other features, is a method for using a pre-amorphizing ion implantation, followed by a subsequent doping ion implantation, to create a well-controlled body contact region for a semiconductor device. This well-controlled body contact region can both increase the ruggedness of a semiconductor device, and decrease the cost of manufacturing it.

While the subject matter of the invention is described and illustrated with reference to specific embodiments and example embodiments, the foregoing drawings and descriptions thereof depict only typical embodiments of the subject matter and are not therefore to be considered to be limiting of its scope. Those skilled in the art will recognize that many modifications and variations can be made without departing from the spirit of the invention. Therefore, it is intended that this invention encompass all such variations and modifications as fall within the scope of the appended claims.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, the subject matter has been described for a particular n-channel MOSFET structure, although the method and structure is directly applicable to other MOS transistors, as wells as bipolar, BiCMOS, metal semiconductor FETs (MESFETs), HFETs, thyristors bi-directional transistors, and other transistor structures. Also, the structures illustrated and described herein can be scaled to provide devices having higher or lower $BV_{DSS}$ characteristics.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

What is claimed is:

1. A semiconductor device comprising:
    a region of semiconductor material of a first conductivity type having a major surface;
    a trench extending into the region of semiconductor material from the major surface;
    an insulator layer formed adjacent sidewall surfaces of the trench;
    a shield electrode in a bottom portion of the trench and overlying a portion of the insulator layer;
    a gate electrode in the trench and overlying the shield electrode;
    a body region of a second conductivity type formed within the region of semiconductor material and adjacent to the gate electrode;
    a source region of the first conductivity type within the body region;
    an amorphized region of the second conductivity type within the body region, wherein the amorphized region is formed as a result of a first ion implantation, wherein the first ion implantation comprises a germanium ion implantation; and
    a body contact region of the second conductivity type within the amorphized region, wherein the body contact region of the second conductivity type is formed as a result of a second ion implantation, wherein the second ion implantation comprises a boron ion implantation.

2. The semiconductor device of claim 1, wherein the germanium ion implantation comprises ion implanting germanium having ion energies in a range of 40 KeV to 150 KeV.

3. The semiconductor device of claim 2, wherein ion implanting germanium comprises ion implanting germanium at an ion dose in a range of $1\times10^{13}$ atoms/cm$^3$ to $1\times10^{16}$ atoms/cm$^3$.

4. The semiconductor device of claim 1, wherein the boron ion implantation comprises ion implanting boron-11 having ion energies in a range of 200 eV to 20 KeV.

5. The semiconductor device of claim 4, wherein ion implanting boron-11 comprises ion implanting boron-11 at an ion dose in a range of $1\times10^{14}$ atoms/cm$^3$ to $5\times10^{15}$ atoms/cm$^3$.

6. The semiconductor device of claim 1, wherein the boron ion implantation comprises ion implanting boron difluoride having ion energies in a range of 200 eV to 80 KeV.

7. The semiconductor device of claim 6, wherein ion implanting boron difluoride comprises ion implanting boron difluoride at an ion dose in a range of $1\times10^{14}$ atoms/cm$^3$ to $5\times10^{15}$ atoms/cm$^3$.

8. A semiconductor device comprising:
    a region of semiconductor material of a first conductivity type having a major surface;
    a trench extending into the region of semiconductor material from the major surface;
    an insulator layer formed adjacent sidewall surfaces of the trench;
    a shield electrode in a bottom portion of the trench and overlying a portion of the insulator layer;
    a gate electrode in the trench and overlying the shield electrode;
    a body region of a second conductivity type formed within the region of semiconductor material and adjacent to the gate electrode;
    a source region of the first conductivity type within the body region;
    an amorphized region of the second conductivity type within the body region, wherein the amorphized region is formed as a result of a first ion implantation, wherein the first ion implantation comprises a silicon ion implantation; and
    a body contact region of the second conductivity type within the amorphized region, wherein the body contact region of the second conductivity type is formed as a result of a second ion implantation, wherein the second ion implantation comprises a boron ion implantation.

9. semiconductor device comprising:
    a region of semiconductor material of a first conductivity type having a major surface;
    a trench extending into the region of semiconductor material from the major surface;
    an insulator layer formed adjacent sidewall surfaces of the trench;
    a shield electrode in a bottom portion of the trench and overlying a portion of the insulator layer;
    a gate electrode in the trench and overlying the shield electrode;
    a body region of a second conductivity type formed within the region of semiconductor material and adjacent to the gate electrode;
    a source region of the first conductivity type within the body region;
    an amorphized region of the second conductivity type within the body region, wherein the amorphized region is formed as a result of a first ion implantation, wherein the first ion implantation comprises an xenon ion implantation; and
    a body contact region of the second conductivity type within the amorphized region, wherein the body contact region of the second conductivity type is formed as a result of a second ion implantation, wherein the second ion implantation comprises a boron ion implantation.

* * * * *